United States Patent
Lee

(10) Patent No.: US 7,889,559 B2
(45) Date of Patent: Feb. 15, 2011

(54) CIRCUIT FOR GENERATING A VOLTAGE AND A NON-VOLATILE MEMORY DEVICE HAVING THE SAME

(75) Inventor: Seok Joo Lee, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 136 days.

(21) Appl. No.: 12/410,414

(22) Filed: Mar. 24, 2009

(65) Prior Publication Data
US 2009/0296480 A1    Dec. 3, 2009

(30) Foreign Application Priority Data
May 28, 2008  (KR) .................. 10-2008-0049628

(51) Int. Cl.
*G11C 16/04* (2006.01)

(52) U.S. Cl. .................. 365/185.18; 365/189.07; 365/189.09

(58) Field of Classification Search ............ 365/185.18, 365/185.12, 185.22, 189.07, 189.09
See application file for complete search history.

(56) References Cited

U.S. PATENT DOCUMENTS

| 7,009,884 B2 * | 3/2006 | Yaoi et al. ............ 365/185.22 |
| 7,366,014 B2 * | 4/2008 | Micheloni et al. ...... 365/185.03 |
| 2005/0248991 A1 * | 11/2005 | Lee et al. .............. 365/185.28 |

FOREIGN PATENT DOCUMENTS
KR    100816214 B1    3/2008

* cited by examiner

*Primary Examiner*—Gene N Auduong
(74) *Attorney, Agent, or Firm*—IP & T Group LLP

(57) ABSTRACT

A circuit for providing a voltage, which includes a first voltage generating circuit to output a first voltage generated by dividing an input voltage on the basis of resistance rate varied in accordance with a first control signal, a second voltage generating circuit to output a third voltage by using a second voltage, where the third voltage is shifted in accordance with a temperature, a third voltage generating circuit to change the third voltage by using a voltage shift rate set in accordance with a level of an operation voltage to be outputted at the temperature, thereby outputting a fourth voltage, and a comparison amplifying circuit configured to output the operation voltage in accordance with the first voltage, the fourth voltage and resistance rate.

23 Claims, 6 Drawing Sheets

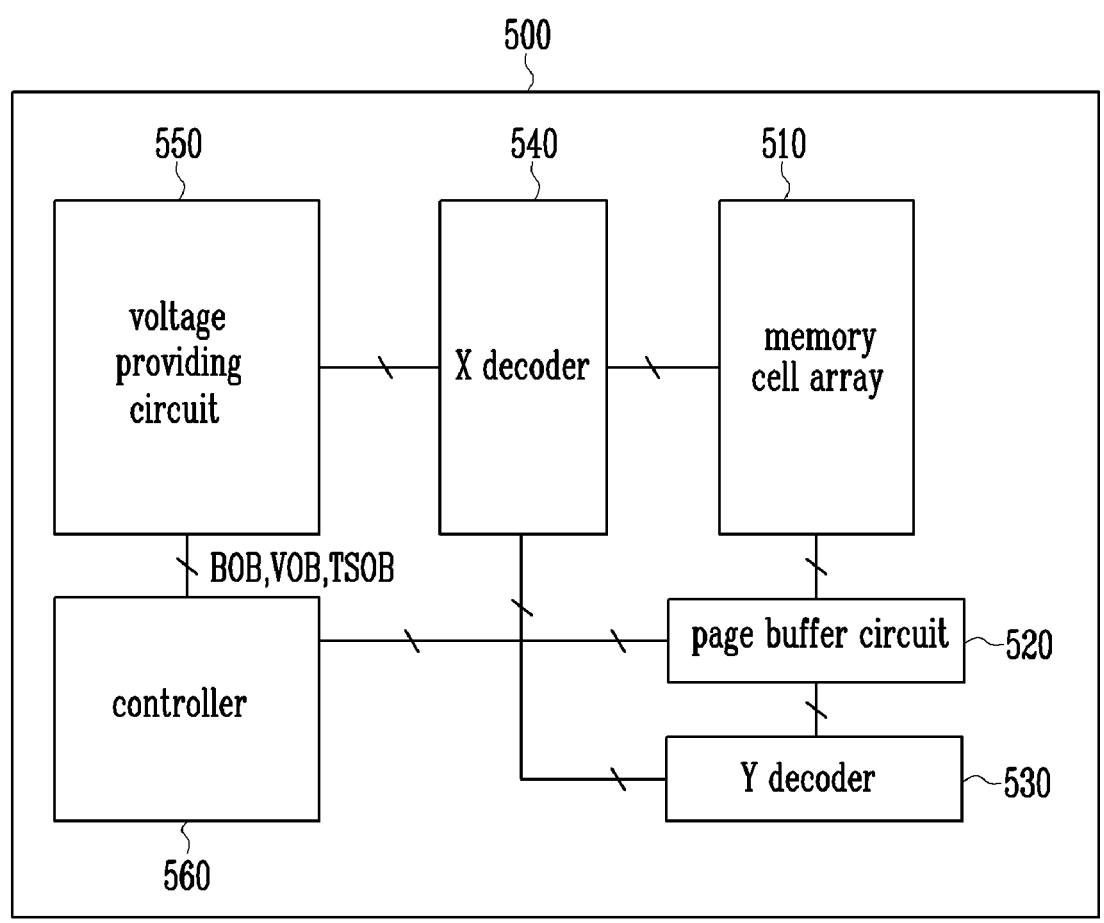

CIRCUIT FOR GENERATING A VOLTAGE AND A NON-VOLATILE MEMORY DEVICE HAVING THE SAME

CROSS-REFERENCE TO RELATED APPLICATION

This application claims priority from Korean Patent Application No. 10-2008-0049628, filed on May 28, 2008, the contents of which are incorporated herein by reference in their entirety.

BACKGROUND OF THE INVENTION

The present invention relates to a circuit for generating an operation voltage of a non-volatile memory device. More particularly, the present invention relates to a circuit for generating a voltage in accordance with program state of a memory cell and an ambient temperature, and a non-volatile memory device having the same.

A semiconductor memory device is a memory device for storing data and reading the data when appropriate. This semiconductor memory device includes a volatile memory in which data are erased when power is turned off and a non-volatile memory in which data are not erased even though power is turned off.

A flash memory erases electrically and collectively data in a memory cell, and so the flash memory is widely used in computers and memory cards, etc.

A memory cell in the non-volatile memory device has a current path formed between a source and a drain on a semiconductor substrate, and a floating gate and a control gate located between insulating layers on the semiconductor substrate.

A program operation of the flash memory cell is generally performed through Fowler-Nordheim tunneling (hereinafter, referred to as "F-N tunneling") generated by applying a high program voltage Vpp having a positive level, e.g. 15V to 20V, to the control gate after connecting source/drain areas and the semiconductor substrate, i.e. bulk area to a ground. Here, an electric field, generated by the voltage Vpp applied to the control gate, moves electrons of the bulk area to the floating gate through F-N tunneling, thereby increasing a threshold voltage of the memory cell.

An erase operation of the memory cell is performed through F-N tunneling generated by applying a high erase voltage Vera having a negative level, e.g. −10V to the control gate and applying a certain voltage, e.g. −5V to the bulk area, and is simultaneously performed in a unit of a sector sharing the bulk area.

The F-N tunneling outputs the electrons in the floating gate to the source area, and thus the memory cells have erase threshold voltage distributions of about −2V to −3V.

It has been determined that a memory cell, in which a threshold voltage is increased in accordance with the program operation, is turned off because current is not injected from the drain area to the source area in a read operation. However, it has also been determined that a memory cell, in which a threshold voltage is reduced in accordance with the erase operation, is turned on because current is injected from the drain area to the source area.

As mentioned above, the non-volatile memory device performs the read operation for reading data and a verifying operation by applying a fixed read voltage and a verifying voltage to a gate of a selected memory cell. Here, the threshold voltage distribution of the memory cell may be changed in accordance with temperature, and so a read margin may be reduced. As a result, undesired data may be read.

FIG. 1A is a view illustrating threshold voltage distributions of memory cells in a non-volatile memory device.

In FIG. 1A, a memory cell for storing two bit information in a non-volatile memory device, has four threshold voltage distributions. In this case, a threshold voltage of the memory cell is changed in accordance with an ambient temperature as shown in FIG. 1A. Here, the higher the threshold voltage of the memory cell is, the smaller the change in the threshold voltage.

FIG. 1B is a view illustrating change of a threshold voltage of a memory cell in accordance with temperature.

FIG. 1B shows threshold voltage distributions of memory cells programmed at high temperature H (CASE1), normal temperature R (CASE2) and low temperature C (CASE3), threshold voltage distributions 151 of erased memory cells in a read operation, and threshold voltage distributions 152 of programmed memory cells.

As shown in FIG. 1B, in a case where the verifying voltage is fixed, the threshold voltage of the memory cell is increased accordingly as the temperature is augmented when the program operation is performed. However, in a case where data of the memory cell is read after the program operation is performed, the threshold voltage of the memory cell is reduced accordingly as the temperature is increased.

That is, in CASE1, the difference between the read voltage and the threshold voltage of a programmed memory cell '0' in the read operation is minimized when the program operation is performed at low temperature and the read operation is performed at high temperature. Accordingly, in the case of reading the memory cell '0', data of the memory cell may be misread as '1' instead of '0'.

In CASE 3, the difference between the read voltage and the threshold voltage of a programmed memory cell '1' in the read operation is minimized when the program operation is performed at high temperature and the read operation is performed at low temperature. Accordingly, data of the memory cell may be misread as '0' instead of '1'.

FIG. 2A is a block diagram illustrating a read voltage generator that is not affected by a temperature, and FIG. 2B is a view illustrating a graph showing the relation between output voltage and temperature.

In FIG. 2A and FIG. 2B, the read voltage generator 200 for outputting a read voltage Vread for a read operation adjusts the level of the read voltage Vread in accordance with a bias option bit, and outputs the adjusted read voltage Vread.

As shown in FIG. 2B, the read voltage Vread outputted from the read voltage generator 200 is reduced accordingly as the temperature is increased.

As described above, the possibility of a read error of the data is increased or reduced in accordance with the difference between the temperature for the program operation and the temperature for the read operation.

SUMMARY OF THE INVENTION

It is a feature of the present invention to provide a circuit for providing a voltage for changing and providing a read voltage in accordance with an ambient temperature and program state when reading data, and a non-volatile memory device having the same.

A circuit for generating a voltage according to one example embodiment of the present invention includes a first voltage generating circuit configured to output a first voltage generated by dividing an input voltage on the basis of resistance rate varied in accordance with a first control signal; a second voltage generating circuit configured to output a third voltage by using a second voltage, wherein the third voltage is shifted in accordance with a temperature; a third voltage generating circuit configured to change the third voltage by using voltage shift rate which is setted respectively in accordance with level of an operation voltage to be outputted at the temperature, thereby outputting a fourth voltage; and a comparison amplifying circuit configured to output the operation voltage in accordance with the first voltage, the fourth voltage and resistance rate.

The input voltage is divided on the basis of the resistance rate in accordance with the second voltage, wherein the resistance rate is set in accordance with a second control signal.

The first voltage generating circuit includes a first comparator configured to output the input voltage in accordance with the result of comparing the input voltage and a first comparing voltage; and a first resistor group and a second resistor group configured to have different resistances in accordance with a third control signal so as to output the fourth voltage by dividing an output voltage of the first comparator.

The first comparing voltage is a voltage divided by the first resistor group and the second resistor group.

The first control signal changes the resistance of the first resistor group and the second resistor group in accordance with the level of the operation voltage.

The second voltage generating circuit includes a switching means turned on/off in accordance with the second voltage; and a variable resistor coupled between the switching means and a ground node and changed in accordance with temperature.

The third voltage shifted by the temperature is outputted in accordance with the resistance rate of the variable resistor and a specific resistor in the case where the switching means is turned on.

The third voltage generating circuit includes a second comparator configured to output the third voltage in accordance with the result of comparing the third voltage and a second comparing voltage; and a third resistor group and a fourth resistor group configured to have different resistances in accordance with a third control signal, so as to output the fourth voltage by dividing an output voltage of the second comparator.

The second comparing voltage is a voltage divided by the third resistor group and the fourth resistor group.

The third control signal is inputted in accordance with voltage shift rate set depending on the level of the operation voltage.

The comparison amplifying circuit includes a first resistor and a second resistor; and a comparison amplifier configured to amplify and output difference of the first voltage and the fourth voltage in accordance with resistance rate of the first resistor and the second resistor.

A non-volatile memory device according to one example embodiment of the present invention includes a memory cell array configured to have memory cells for storing data; a page buffer circuit configured to page buffers coupled to a bit line coupled to the memory cells of the memory cell array, and store temporarily data to be programmed to a selected memory cell or read data from a selected memory cell; a voltage providing circuit configured to provide a read voltage or a verifying voltage changed in accordance with control signals, wherein the control signals are generated in accordance with voltage shift rate set differently depending on the level of the read voltage or the verifying voltage at the present temperature; and a controller configured to output a control signal for storing the data in the memory cell array or reading the data, and outputting the control signals for controlling the voltage providing circuit.

The voltage providing circuit includes a first voltage generating circuit configured to output a first voltage generated by dividing an input voltage on the basis of resistance rate varied in accordance with the first control signal; a second voltage generating circuit configured to output a third voltage by using a second voltage, wherein the third voltage is shifted in accordance with temperature; a third voltage generating circuit configured to change the third voltage by using the voltage shift rate set differently in accordance with level of an operation voltage to be outputted at the temperature, thereby outputting a fourth voltage; and a comparison amplifying circuit configured to output the operation voltage in accordance with the first voltage, the fourth voltage and resistance rate.

The input voltage is divided on the basis of the resistance rate in accordance with the second voltage, wherein the resistance rate is set differently in accordance with a second control signal.

The first voltage generating circuit includes a first comparator configured to output the input voltage in accordance with the result of comparing the input voltage and a first comparing voltage; and a first resistor group and a second resistor group configured to have different resistances in accordance with a third control signal so as to output the fourth voltage generated by dividing an output voltage of the first comparator.

The first comparing voltage is a voltage divided by the first resistor group and the second resistor group.

The first control signal changes the resistance of the first resistor group and the second resistor group in accordance with the level of the operation voltage.

The second voltage generating circuit includes a switching means turned on/off in accordance with the second voltage; and a variable resistor coupled between the switching means and a ground node and changed in accordance with a temperature.

The third voltage shifted by the temperature is outputted in accordance with resistance rate of the variable resistor and a specific resistor in the case where the switching means is turned on.

The third voltage generating circuit includes a second comparator configured to output the third voltage in accordance with the result of comparing the third voltage and a second comparing voltage; and a third resistor group and a fourth resistor group configured to have different resistances in accordance with a third control signal so as to output the fourth voltage by dividing an output voltage of the second comparator.

The second comparing voltage is a voltage divided by the third resistor group and the fourth resistor group.

The third control signal is inputted in accordance with voltage shift rate set depending on the level of the operation voltage.

The comparison amplifying circuit includes a first resistor and a second resistor; and a comparison amplifier configured to amplify and output difference of the first voltage and the fourth voltage in accordance with resistance rate of the first resistor and the second resistor.

As described above, a circuit for providing a voltage and a non-volatile memory device having the same changes a read voltage in accordance with an ambient temperature and level of a threshold voltage of a programmed memory cell, and so data read error may be reduced.

BRIEF DESCRIPTION OF THE DRAWINGS

The above and other features and advantages of the present invention will become readily apparent by reference to the following detailed description when considered in conjunction with the accompanying drawings wherein:

FIG. 5 is a block diagram illustrating a non-volatile memory device according to one embodiment of the present invention.

DESCRIPTION OF SPECIFIC EMBODIMENTS

Hereinafter, the preferred embodiments of the present invention will be explained in more detail with reference to the accompanying drawings.

Figure 1A:
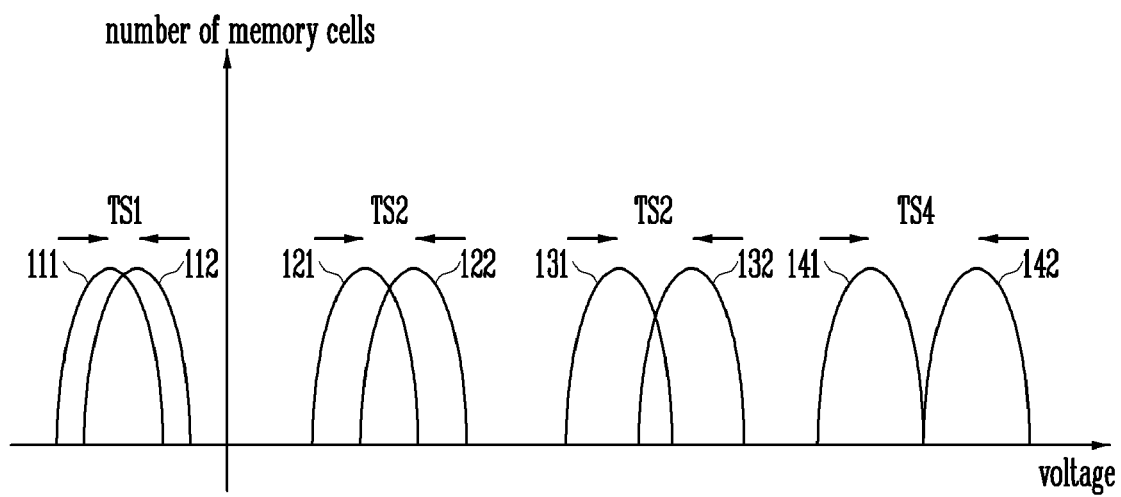
FIG. 1A is a view illustrating threshold voltage distributions of memory cells in a non-volatile memory device.
Figure 1B:
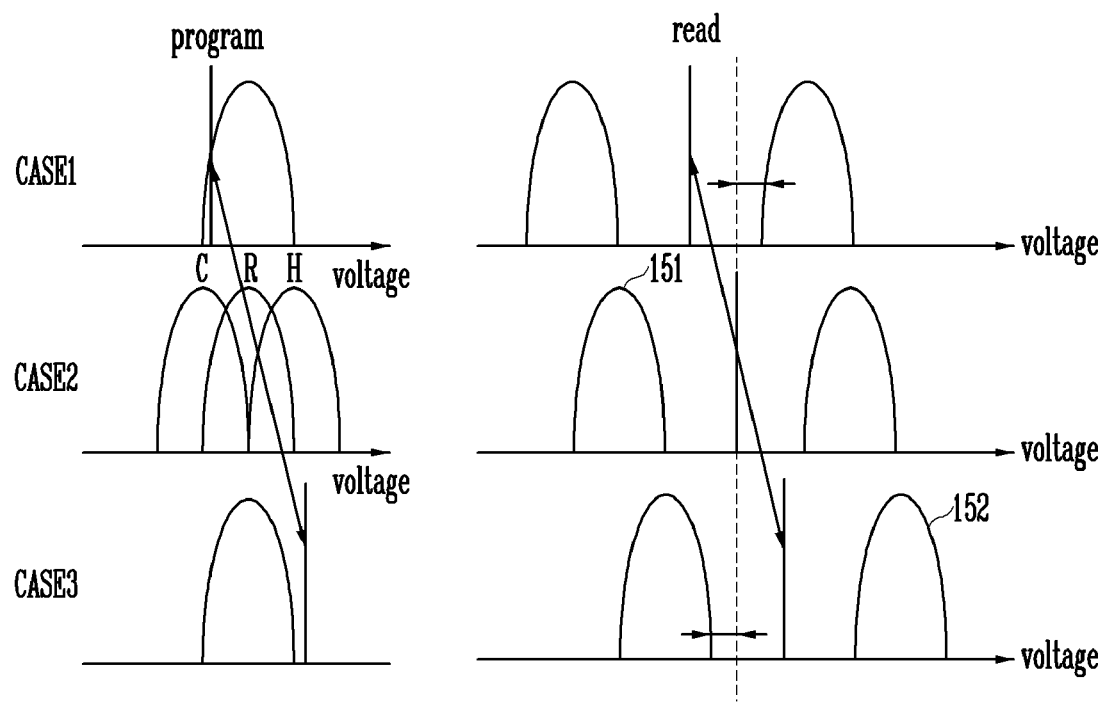
FIG. 1B is a view illustrating change of a threshold voltage of a memory cell in accordance with temperature.
Figure 2A:
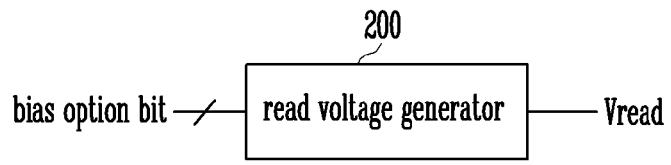
FIG. 2A is a block diagram illustrating a read voltage generator which is not affected by temperature.
Figure 2B:
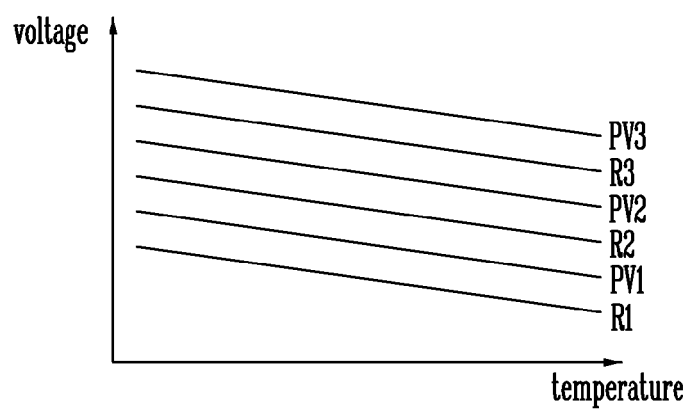
FIG. 2B is a view illustrating a graph showing the relation between an output voltage and a temperature.
Figure 3A:
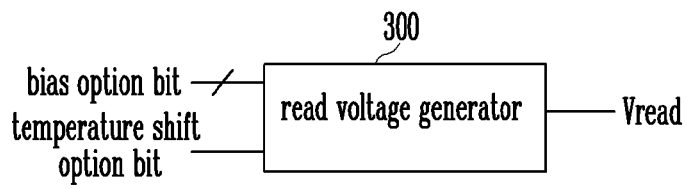
FIG. 3A is a block diagram illustrating a read voltage generator for outputting a read voltage in accordance with temperature.
Figure 3B:
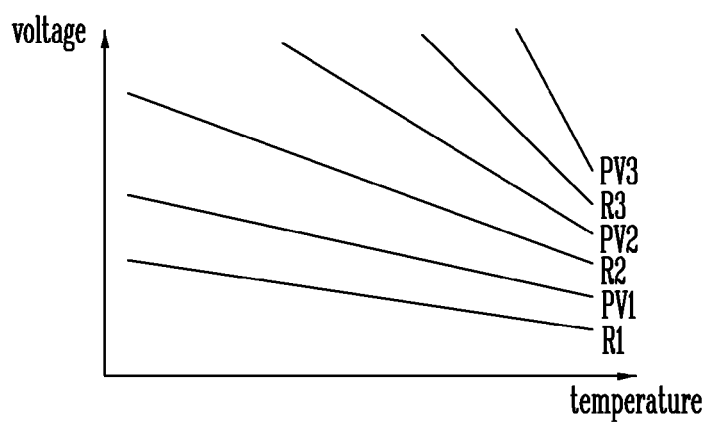
FIG. 3B is a view illustrating a graph showing the relation between temperature and output voltage.

FIG. 3A is a block diagram illustrating a read voltage generator for outputting a read voltage in accordance with temperature, and FIG. 3B is a view illustrating a graph showing the relation between temperature and output voltage.

In FIG. 3A, a threshold voltage of a memory cell in a non-volatile memory device is changed in accordance with temperature, and thus the read voltage generator 300, for generating a read voltage Vread for a read operation, changes an output voltage, i.e. read voltage Vread in accordance with temperature.

The read voltage generator 300 in FIG. 3A receives a temperature shift option bit considering change of temperature as well as a bias option bit. Then, the read voltage generator 300 controls the level of the read voltage Vread by using the bias option bit and the temperature shift option bit.

However, it is verified that level shift of the read voltage Vread outputted from the read voltage generator 300 in accordance with increase of temperature is different in accordance with a threshold voltage as shown in FIG. 3B. Accordingly, read error may be generated in accordance with the threshold voltage of the memory cell though the read voltage generator 300 changes the read voltage Vread in accordance with the temperature.

Accordingly, the following read voltage generator is provided.

Figure 4A:
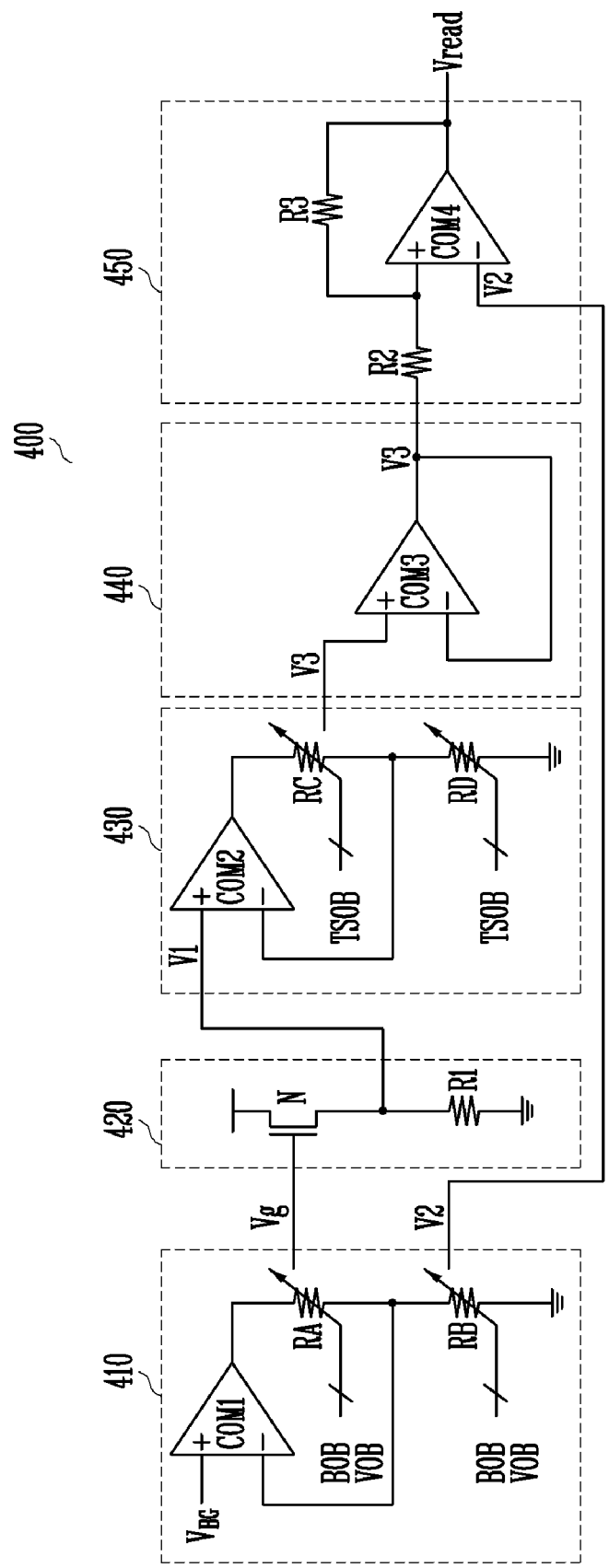
FIG. 4A is a view illustrating circuitry of a read voltage generator according to one embodiment of the present invention.

FIG. 4A is a view illustrating circuitry of a read voltage generator according to one example embodiment of the present invention.

In FIG. 4A, the read voltage generator 400 of the present embodiment includes first to third voltage generating circuits 410 to 430, a buffer circuit 440 and a comparison amplifying circuit 450.

The first voltage generating circuit 410 outputs a second voltage V2 and an operation voltage Vg in accordance with a bias option bit BOB and an operation voltage option bit VOB.

The second voltage generating circuit 420 outputs a first voltage V1 shifted depending on a temperature in accordance with the operation voltage Vg.

The third voltage generating circuit 430 outputs a third voltage V3 in accordance with the first voltage V1 and a temperature shift option bit TSOB. Here, the third voltage V3 is more sensitive to the temperature than the first voltage V1.

The buffer circuit 440 outputs the third voltage V3 as a driving voltage for driving the comparison amplifying circuit 450.

The comparison amplifying circuit 450 compares and amplifies the third voltage V3 and the second voltage V2 outputted from the first voltage generating circuit 410 in accordance with resistance rate, and outputs the amplified voltage as a read voltage Vread.

The first voltage generating circuit 410 includes a first comparator COM1, a first resistor group RA and a second resistor group RB.

The second voltage generating circuit 420 has an N-MOS transistor N and a first resistor R1.

The third voltage generating circuit 430 includes a second comparator COM2, a third resistor group RC and a fourth resistor group RD.

The buffer circuit 440 has a third comparator COM3.

The comparison amplifying circuit 450 includes a fourth comparator COM4, a second resistor R2 and a third resistor R3.

The first resistor group RA and the second resistor group RB of the first voltage generating circuit 410 are controlled by the bias option bit BOB and the operation voltage option bit VOB.

The third resistor group RC and the fourth resistor group RD of the third voltage generating circuit 430 are controlled by the temperature shift option bit TSOB.

Hereinafter, the first voltage generating circuit 410 will be described in detail.

Figure 4B:
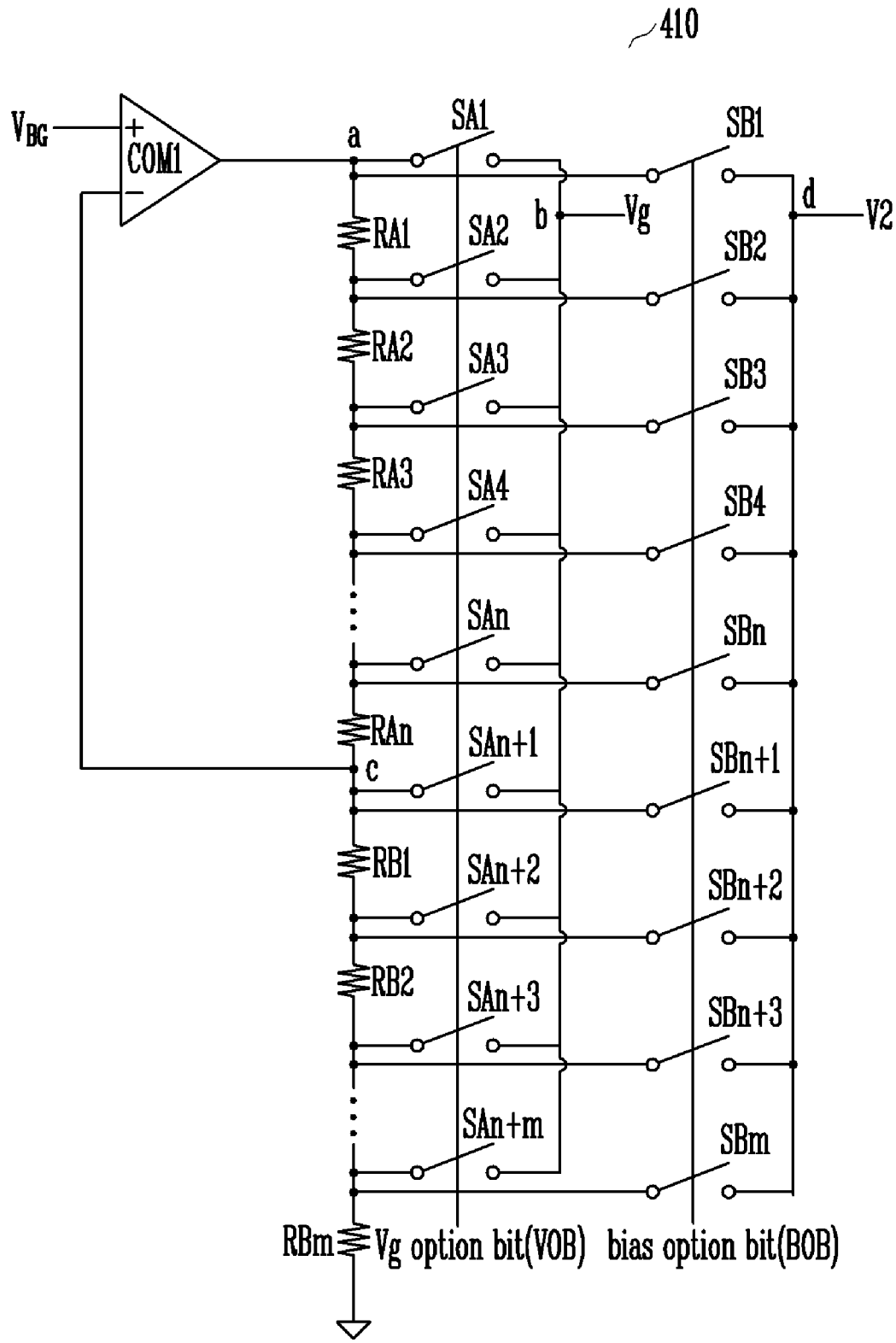
FIG. 4B is a view illustrating the first voltage generating circuit in FIG. 4A.

FIG. 4B is a view illustrating the first voltage generating circuit in FIG. 4A.

In FIG. 4B, the first voltage generating circuit 410 includes the first comparator COM1, the first resistor group RA having first to nth resistors RA1 to RAn, the second resistor group RB having first to mth resistors RB1 to RBm, a first switch group SA having first to mth switches SA1 to SA(n+m), and a second switch group having first to mth switches SB1 to SB(n+m).

A voltage $V_{BG}$ is inputted to a non-inverting terminal (+) of the first comparator COM1, and a node C is coupled to an inverting terminal (−) of the first comparator COM1.

The first to nth resistors RA1 to RAn are coupled in series between a node A and the node C.

The first to mth resistors RB1 to RBm are coupled between the node C and a ground node.

The first to (n+m)th switches SA1 to SA(n+m) are coupled between each node between the resistors RA1 to RAn, RB1 to RBm and a node B.

The first to (n+m)th switches SB1 to SB(n+m) are coupled between each node between the resistors RA1 to Ran, RB1 to RBm and a node D.

The first switch group SA having the first to (n+m) switches SA1 to SA(n+m) is operated by the operation voltage option bit VOB for controlling the operation voltage Vg.

The second switch group SB having the first to (n+m) switches SB1 to SB(n+m) is operated by the bias option bit BOB for controlling the second voltage V2.

The second voltage generating circuit 420 outputs the first voltage V1 in accordance with the operation voltage Vg, wherein the first voltage Vg is shifted in accordance with the temperature.

The second voltage V2 is amplified by the comparison amplifying circuit 450, and then the amplified voltage is outputted as the read voltage Vread.

The second voltage V2 is differently controlled in accordance with level of desired read voltage Vread.

The N-MOS transistor N and the first resistor R1 of the second voltage generating circuit 420 are coupled in series between a power supply voltage and the ground node.

The operation voltage Vg outputted from the first voltage generating circuit 410 is inputted to a gate of the N-MOS transistor N1.

The first voltage V1 is outputted from a node between the N-MOS transistor N and the first resistor R1.

The first voltage V1 equals to the operation voltage Vg minus a threshold voltage Vth of the N-MOS transistor N. In other words, 'V1=Vg−Vth'.

The first voltage V1 is inputted to the third voltage generating circuit 430.

The third voltage generating circuit 430 outputs the third voltage V3 shifted, considering temperature change value, in accordance with voltage bias by the temperature shift option bit TSOB.

Figure 4C:
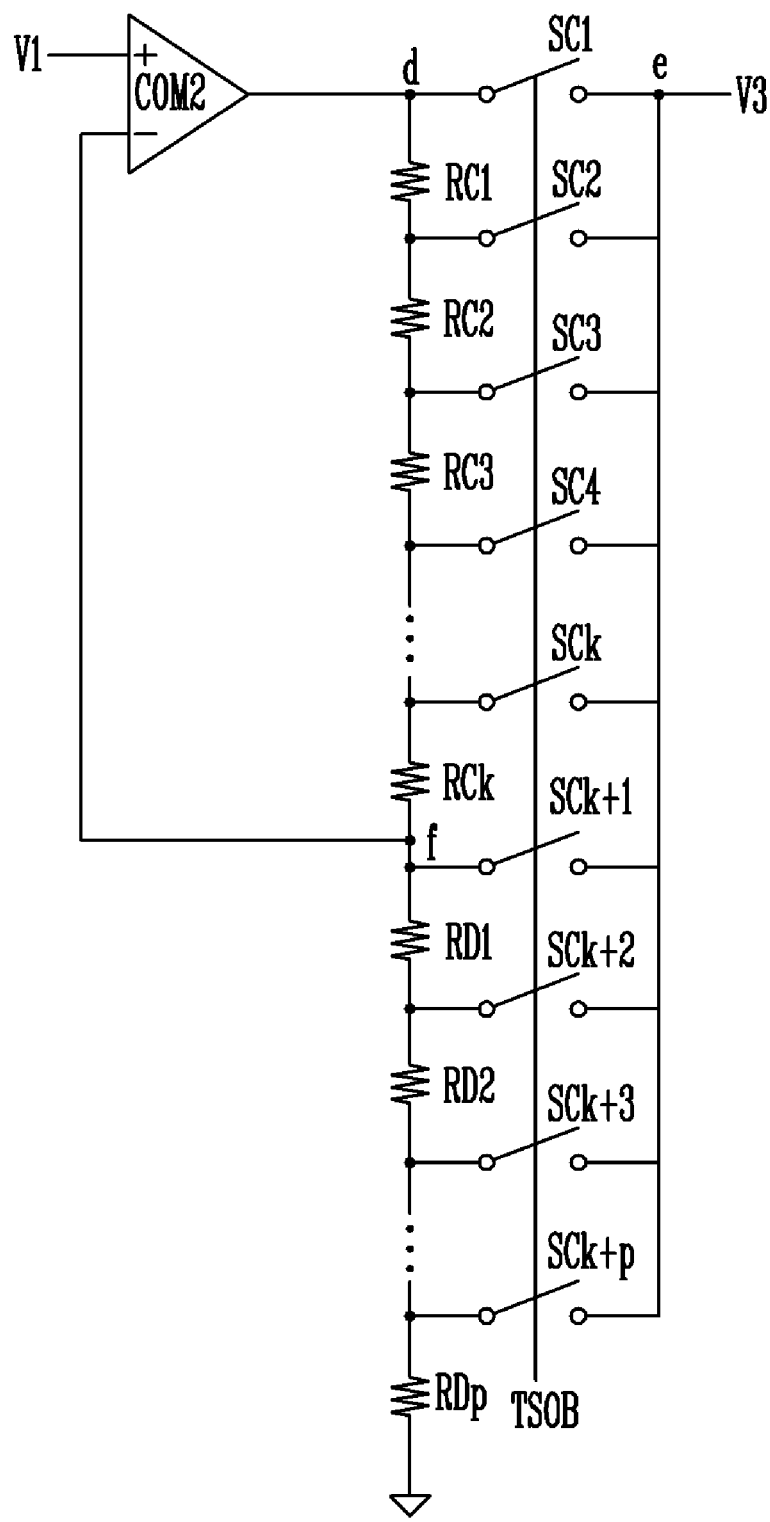
FIG. 4C is a view illustrating circuitry of the third voltage generating circuit in FIG. 4A.

FIG. 4C is a view illustrating circuitry of the third voltage generating circuit in FIG. 4A.

In FIG. 4C, the third voltage generating circuit 430 includes the second comparator COM2, the third resistor group RC having first to kth resistors RC1 to RCk, the fourth resistor group RD having first to pth resistors RD1 to RDp, and a third switch group SC having first to (k+p)th switches SC1 to SC(k+p).

The first voltage V1 outputted from the second voltage generating circuit 420 is inputted to a non-inverting terminal (+) of the second comparator COM2, and a node F is coupled to an inverting terminal (−) of the second comparator COM2.

The resistors RC1 to RCk of the third resistor group RC are coupled in series between the node D and the node F.

The resistors RD1 to RDp of the fourth resistor group RD are coupled in series between the node F and the ground node.

The switches SC1 to SC(k+p) are coupled between each node between the resistors RC1 to RCk, RD1 to RDp and a node E.

The third switch group SC is controlled by the temperature shift option bit TSOB.

The third voltage V3 is outputted from the node E.

The temperature shift option bit TSOB is differently set in accordance with level of desired read voltage Vread. That is, since voltage shift of the read voltage Vread is different in accordance with the threshold voltage distribution of the memory cell, the temperature shift option bit TSOB is differently set in accordance with the threshold voltage distribution of the memory cell. As a result, temperature shift value may be differently set in accordance with the threshold voltage distribution of the memory cell.

The third voltage V3 is outputted as the driving voltage for operating the comparison amplifying circuit 450 through the buffer circuit 440.

The second resistor R2 of the comparison amplifying circuit 450 in FIG. 4A is coupled between an output terminal of the buffer circuit 440 and the inverting terminal (−) of the fourth comparator COM4.

The third resistor R3 is coupled between the inverting terminal (−) and the output terminal of the fourth comparator COM4.

The second voltage V2 outputted from the first voltage generating circuit 410 is inputted to the non-inverting terminal (+) of the fourth comparator COM4.

An output voltage of the fourth comparator COM4 is the read voltage Vread.

The read voltage Vread outputted from the fourth comparator COM4 is given by the following equation 1.

$$Vread = V2 + \frac{R2}{R1}(V2 - V3) \qquad \text{[Equation 1]}$$

Referring to the equation 1, the third voltage V3 is outputted in accordance with the temperature shift option bit TSOB set differently depending on the threshold voltage distribution. As a result, a level shift of the read voltage Vread in accordance with the temperature may be differently set in accordance with the threshold voltage distribution.

FIG. 5 is a block diagram illustrating a non-volatile memory device according to one example embodiment of the present invention.

In FIG. 5, the non-volatile memory device 500 of the present embodiment includes a memory cell array 510, a page buffer circuit 520, a Y decoder 530, an X decoder 540, a voltage providing circuit 550 and a controller 560.

The memory cell array 510 has a plurality of memory cells (not shown) for storing data. Here, the memory cells are disposed by bit lines BL and word lines WL.

The page buffer circuit 520 has a plurality of page buffers.

Each of the page buffers is coupled to a pair of bit lines BL of the memory cell array 510, and programs data in a memory cell coupled to the bit line or reads data from the memory cell.

The Y decoder 530 provides data input/output path to the page buffers in accordance with a control signal.

The X decoder 540 selects word line WL in accordance with an input address.

The voltage providing circuit 550 generates and provides a voltage for operation of the non-volatile memory device 500.

The controller 560 outputs the control signal for controlling the operation of the non-volatile memory device 500. Specially, the controller 560 provides the bias option bit BOB, the operation voltage option bit VOB and the temperature shift option bit TSOB to the voltage providing circuit 550 in accordance with the threshold voltage distribution of the memory cell when the read operation or a verifying operation is performed.

The voltage providing circuit 550 generates the voltage for operation of the non-volatile memory device 500, and includes an operation voltage providing circuit as shown in FIG. 4A.

This voltage providing circuit 550 outputs the read voltage Vread in accordance with the bias option bit BOB, the operation voltage option bit VOB and the temperature shift option bit TSOB provided from the controller 560, wherein level shift of the read voltage Vread in accordance with the temperature is different in accordance with the threshold voltage distribution of the memory cell.

That is, the non-volatile memory device 500 uses the read voltage or the verifying voltage set differently in accordance with the threshold voltage distribution and the temperature as described above, thereby minimizing operation error.

In above description, the read voltage Vread is mentioned. However, this method may be applied to a circuit for generating the verifying voltage because the verifying operation is similar to the read operation.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A circuit for generating a voltage comprising:
    a first voltage generating circuit configured to output a first voltage generated by dividing an input voltage on the basis of resistance rate varied in accordance with a first control signal;
    a second voltage generating circuit configured to output a third voltage by using a second voltage, wherein the third voltage is shifted in accordance with a temperature;
    a third voltage generating circuit configured to change the third voltage by using a voltage shift rate which is setted respectively in accordance with a level of an operation voltage to be outputted at the temperature, thereby outputting a fourth voltage; and
    a comparison amplifying circuit configured to output the operation voltage in accordance with the first voltage, the fourth voltage and resistance rate.

2. The circuit of claim 1, wherein the input voltage is divided on the basis of the resistance rate in accordance with the second voltage, wherein the resistance rate is set in accordance with a second control signal.

3. The circuit of claim 2, wherein the first voltage generating circuit includes:
    a first comparator configured to output the input voltage in accordance with a result of comparing the input voltage and a first comparing voltage; and
    a first resistor group and a second resistor group configured to have different resistances in accordance with a third control signal so as to output the fourth voltage by dividing an output voltage of the first comparator.

4. The circuit of claim 3, wherein the first comparing voltage is a voltage divided by the first resistor group and the second resistor group.

5. The circuit of claim 3, wherein the first control signal changes the resistance of the first resistor group and the second resistor group in accordance with the level of the operation voltage.

6. The circuit of claim 1, wherein the second voltage generating circuit includes:
    a switching means turned on/off in accordance with the second voltage; and
    a variable resistor coupled between the switching means and a ground node and changed in accordance with the temperature.

7. The circuit of claim 6, wherein the third voltage shifted by the temperature is outputted in accordance with resistance rate of the variable resistor and a specific resistor if the switching means is turned on.

8. The circuit of claim 1, wherein the third voltage generating circuit includes:
    a second comparator configured to output the third voltage in accordance with a result of comparing the third voltage and a second comparing voltage; and
    a third resistor group and a fourth resistor group configured to have different resistances in accordance with a third control signal so as to output the fourth voltage by dividing an output voltage of the second comparator.

9. The circuit of claim 8, wherein the second comparing voltage is a voltage divided by the third resistor group and the fourth resistor group.

10. The circuit of claim 8, wherein the third control signal is inputted in accordance with a voltage shift rate set depending on the level of the operation voltage.

11. The circuit of claim 1, wherein the comparison amplifying circuit includes:
    a first resistor and a second resistor; and
    a comparison amplifier configured to amplify and output a difference between the first voltage and the fourth voltage in accordance with resistance rate of the first resistor and the second resistor.

12. A non-volatile memory device comprising:
    a memory cell array configured to have memory cells for storing data;
    a page buffer circuit configured to have page buffers coupled to a bit line coupled to the memory cells of the memory cell array, and store temporarily data to be programmed to a selected memory cell or read data from a selected memory cell;
    a voltage providing circuit configured to provide a read voltage or a verifying voltage changed in accordance with control signals, wherein the control signals are generated in accordance with a voltage shift rate set depending on a level of the read voltage or the verifying voltage at a temperature; and
    a controller configured to output a control signal for storing the data in the memory cell array or reading the data, and outputting the control signals for controlling the voltage providing circuit.

13. The non-volatile memory device of claim 12, wherein the voltage providing circuit includes:
    a first voltage generating circuit configured to output a first voltage generated by dividing an input voltage on the basis of resistance rate varied in accordance with the first control signal;
    a second voltage generating circuit configured to output a third voltage by using a second voltage, wherein the third voltage is shifted in accordance with the temperature;
    a third voltage generating circuit configured to change the third voltage by using the voltage shift rate set in accordance with a level of an operation voltage to be outputted at the temperature, thereby outputting a fourth voltage; and
    a comparison amplifying circuit configured to output the operation voltage in accordance with the first voltage, the fourth voltage and resistance rate.

14. The non-volatile memory device of claim 13, wherein the input voltage is divided on the basis of the resistance rate in accordance with the second voltage, wherein the resistance rate is set differently in accordance with a second control signal.

15. The non-volatile memory device of claim 14, wherein the first voltage generating circuit includes:
   a first comparator configured to output the input voltage in accordance with a result of comparing the input voltage and a first comparing voltage; and
   a first resistor group and a second resistor group configured to have different resistances in accordance with a third control signal so as to output the fourth voltage by dividing an output voltage of the first comparator.

16. The non-volatile memory device of claim 15, wherein the first comparing voltage is a voltage divided by the first resistor group and the second resistor group.

17. The non-volatile memory device of claim 15, wherein the first control signal changes the resistance of the first resistor group and the second resistor group in accordance with the level of the operation voltage.

18. The non-volatile memory device of claim 13, wherein the second voltage generating circuit includes:
   a switching means turned on/off in accordance with the second voltage; and
   a variable resistor coupled between the switching means and a ground node and changed in accordance with a temperature.

19. The non-volatile memory device of claim 18, wherein the third voltage shifted by the temperature is outputted in accordance with resistance rate of the variable resistor and a specific resistor if the switching means is turned on.

20. The non-volatile memory device of claim 13, wherein the third voltage generating circuit includes:
   a second comparator configured to output the third voltage in accordance with a result of comparing the third voltage and a second comparing voltage; and
   a third resistor group and a fourth resistor group configured to have different resistances in accordance with a third control signal so as to output the fourth voltage by dividing an output voltage of the second comparator.

21. The non-volatile memory device of claim 20, wherein the second comparing voltage is a voltage divided by the third resistor group and the fourth resistor group.

22. The non-volatile memory device of claim 20, wherein the third control signal is inputted in accordance with a voltage shift rate set depending on the level of the operation voltage.

23. The non-volatile memory device of claim 13, wherein the comparison amplifying circuit includes:
   a first resistor and a second resistor; and
   a comparison amplifier configured to amplify and output a difference between the first voltage and the fourth voltage in accordance with resistance rate of the first resistor and the second resistor.

* * * * *